United States Patent [19]
Von Basse et al.

[11] Patent Number: 6,044,006
[45] Date of Patent: Mar. 28, 2000

[54] METHOD FOR PROGRAMMING A ROM CELL ARRANGEMENT

[75] Inventors: Paul-Werner Von Basse, Wolfratshausen; Roland Thewes, Groebenzell; Doris Schmitt-Lansiedel, Ottobrunn; Michael Bollu, Munich, all of Germany

[73] Assignee: Siemens Aktiengesellschaft, Munich, Germany

[21] Appl. No.: 09/273,648

[22] Filed: Mar. 23, 1999

[30] Foreign Application Priority Data

Mar. 23, 1998 [DE] Germany ............................ 198 12 640

[51] Int. Cl.[7] .................................................. G11C 17/00
[52] U.S. Cl. ............................................. 365/94; 365/104
[58] Field of Search ......................... 365/94, 104

[56] References Cited

U.S. PATENT DOCUMENTS

| | | | |
|---|---|---|---|
| 4,858,194 | 8/1989 | Terada et al. | 365/203 |
| 5,553,019 | 9/1996 | Sandvos et al. | 365/104 |
| 5,831,894 | 11/1998 | Chang | 365/104 |

*Primary Examiner*—Trong Phan
*Attorney, Agent, or Firm*—Hill & Simpson

[57] ABSTRACT

Memory cells are organized in cell fields in word lines and bit lines in the manner of a matrix. The bit lines are actuated by a bit decoder for loading with a mass potential, and by a blocking decoder for loading the bit lines with a blocking potential. The word lines are actuated by a word decoder for loading the word lines with a programming voltage or a protective voltage. The information value to be programmed is prestored in the cell field.

5 Claims, 8 Drawing Sheets

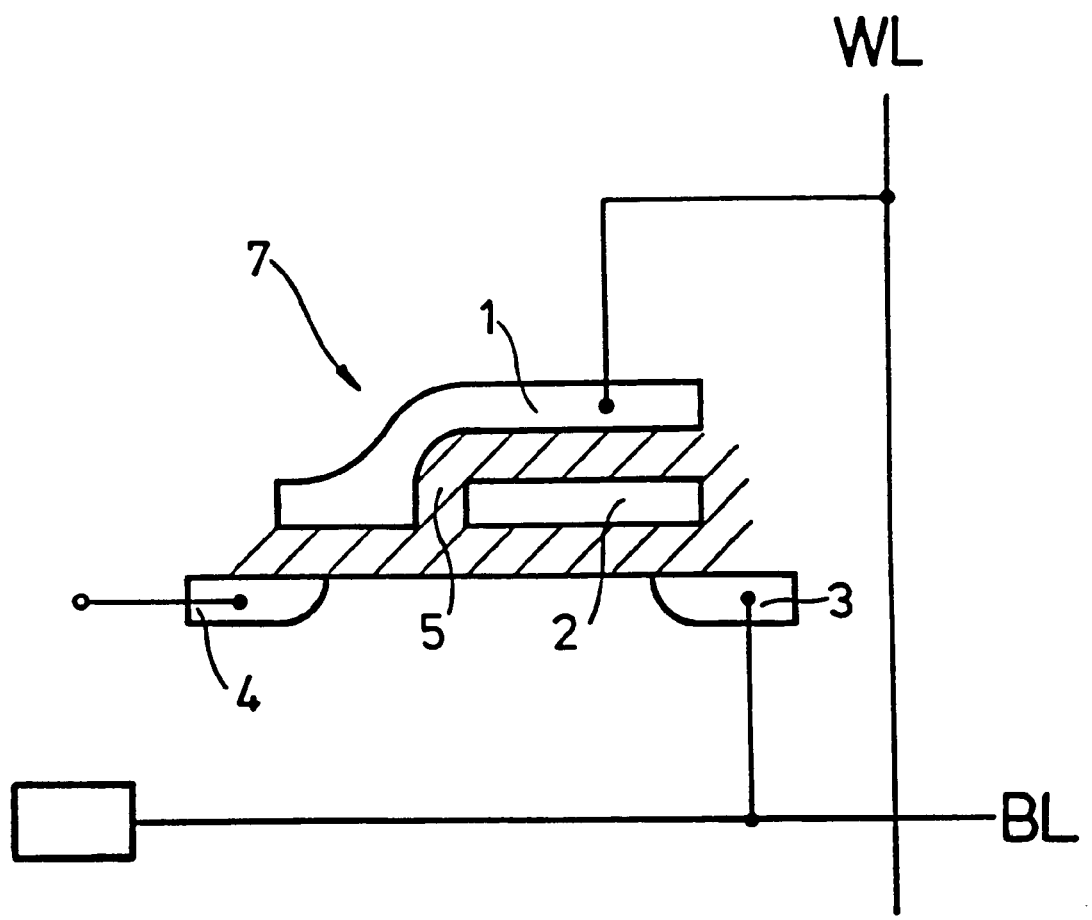

METHOD FOR PROGRAMMING A ROM CELL ARRANGEMENT

BACKGROUND OF THE INVENTION

1. Field of the Invention

The invention relates to a method for programming a ROM cell arrangement on a semiconductor. In particular, the invention relates to producing or programming a ROM cell arrangement that includes decoders.

2. Description of Related Art

Read-only memories, also known as ROMs, are used to store data in many electronic systems. Generally, data in ROM are written in permanently in digital form and are realized as silicon circuits which are constructed in an integrated manner on a basis of a semiconductor material, particularly silicon, and in which MOS transistors are preferably used as memory cells.

In the readout, the individual memory cells are selected via the gate electrode of the MOS transistors, which is connected to a word line. The input of each MOS transistor is connected to a reference line; the output is connected to a bit line. In the read process, it is ascertained whether or not current is flowing through the transistor. The logical values one ("1") and zero ("0") are assigned to the stored data, accordingly.

Technically, the storing of 0 and 1 in these ROMs is effected in that, in memory cells in which the logical value that is assigned to the condition "no current flow through the transistor" is stored, a MOS transistor is not produced, or a conductive connection to the bit line is not realized. Alternatively, corresponding MOS transistors can be realized for the two logical values. The transistors have different inception voltages in the channel region due to different implantations. Such a silicon memory has an essentially planar construction with a minimal surface area per memory cell, yielding a typical memory density of approximately 0.14 bit/$\mu m^2$ in today's one-time technology.

The invention relates primarily to the production of one-time electrically programmable read-only memories, what are known as OTP memories ("One-Time Programmable Memory") in which the gate dielectric usually has an ONO forming material but it can also be used in principle in multiple programmable read-only memories ("MTP-ROMs") in which the gate dielectric has a gate oxide (see FIG. 1).

During the programming process of a memory cell in which very high voltages are applied (e.g. known as the Fowler-Nordheim mechanism), the neighboring cells of the affected cell, which are organized as a matrix in the cell field, must be protected. This typically occurs by applying a blocking voltage at the bit lines of the cells to be protected and applying a protecting voltage at the word lines, in order to keep the voltages at these neighboring cells low. The feeding of the voltages occurs by decoders which are equipped with corresponding high-voltage switches.

A word decoder usually functions as a "1 out of n" decoder during the programming process. The word decoder connects one line to the higher programming voltage, while all the remaining decoder outputs remain at the protective voltage. A bit decoder likewise functions as a "1 out of n" decoder during the programming process. The bit decoder connects one line to the mass potential, while the other bit lines remain at the blocking potential. A blocking decoder typically functions as a "n−1 out of n" decoder and connects those bit lines to the blocking potential at which an information value will not be programmed. The one remaining line is kept at mass potential by the bit decoder. The previously known methods for programming an OTP memory require relatively expensive decoder circuits and are nevertheless relatively slow.

U.S. Pat. No. 4,858,194 teaches a non-volatile semiconductor memory in which the bit lines and word lines are precharged to a fixed blocking voltage prior to the writing, and only in the writing are a relevant bit line and a relevant word line brought to a respective potential depending on the information to be written in.

SUMMARY OF THE INVENTION

It is an object of the invention to provide a method for producing or programming a ROM cell arrangement on a semiconductor basis, particularly of an OTP-ROM, which offers a technical simplification of the decoder in terms of wiring and a simultaneous acceleration of the programming process.

This object is achieved in an embodiment of the invention that provides a method for programming a ROM cell arrangement having a number of memory cells organized in cell fields in word lines and bit lines forming a matrix including actuating the bit lines via a bit decoder and loading the bit lines with a mass potential; actuating the bit lines via a blocking decoder and loading the bit lines with a blocking potential; actuating the word lines via a word decoder and loading the word lines with one of a programming voltage and a protective voltage; and prestoring an information value to be programmed in one of the cell fields.

In an embodiment, the method includes precharging the bit lines with the blocking potential via the blocking decoder; applying the protective voltage to a number of outputs of the word decoder so that the memory cells become conductive and the blocking potential is carried into the whole cell field; decoupling the blocking decoder from the cell field while maintaining the stored blocking potential at all capacitances of the bit lines; activating the bit decoder and connecting one of the bit lines to a line containing the information value to be programmed and transferring the information value to the bit line; selecting a word line via the word decoder and applying the programming potential; programming the memory cell at an intersection of the selected word line and the previously selected bit line; and deactivating the word decoder and the bit decoder.

In an embodiment, the method includes disconnecting the bit decoder after the step of transferring the information value into segments of a track of the cell field in which the segments of the track capacitively store both the blocking voltage and the transferred information value; feeding an information value of a next track to the cell field, and subsequently activating the bit decoder of the next track, intermediately storing the information value of the next track in the next track and disconnecting the bit decoder again; repeating the step of feeding an information value of a next track to the cell field until the information value to be programmed is intermediately stored on a bit line in every track in all segments of the cell field; and subsequently selecting one of the word lines via the word decoder and applying the programming potential.

In an embodiment, the method includes deactivating the word decoder subsequent to the end of the programming time.

In an embodiment, the method includes changing the bit address and starting the storing of the next information value in the first track after the information value is stored in all segments of all the tracks of the cell field; repeating the step of changing the bit address and starting the storing of the next information value until one word line of the information value to be programmed is prestored in each segment in every track of the cell field; subsequently selecting a word line via the word decoder and applying programming potential to the word line; and deactivating the word decoder subsequent to the end of the programming time.

It is inventively provided that the information values to be programmed are preliminarily or intermediately dynamically stored in the cell field of the memory. The inventive dynamic intermediate storage method simplifies the decoder circuits involved in the programming along with accelerating the programming process.

The invention is detailed below with the aid of exemplifying embodiments as depicted in the drawings.

BRIEF DESCRIPTION OF THE DRAWINGS

FIG. 1 is a schematic diagram of an One-Time Programmable ("OTP") memory cell.

DETAILED DESCRIPTION OF THE PREFERRED EMBODIMENTS

Figure 2A:
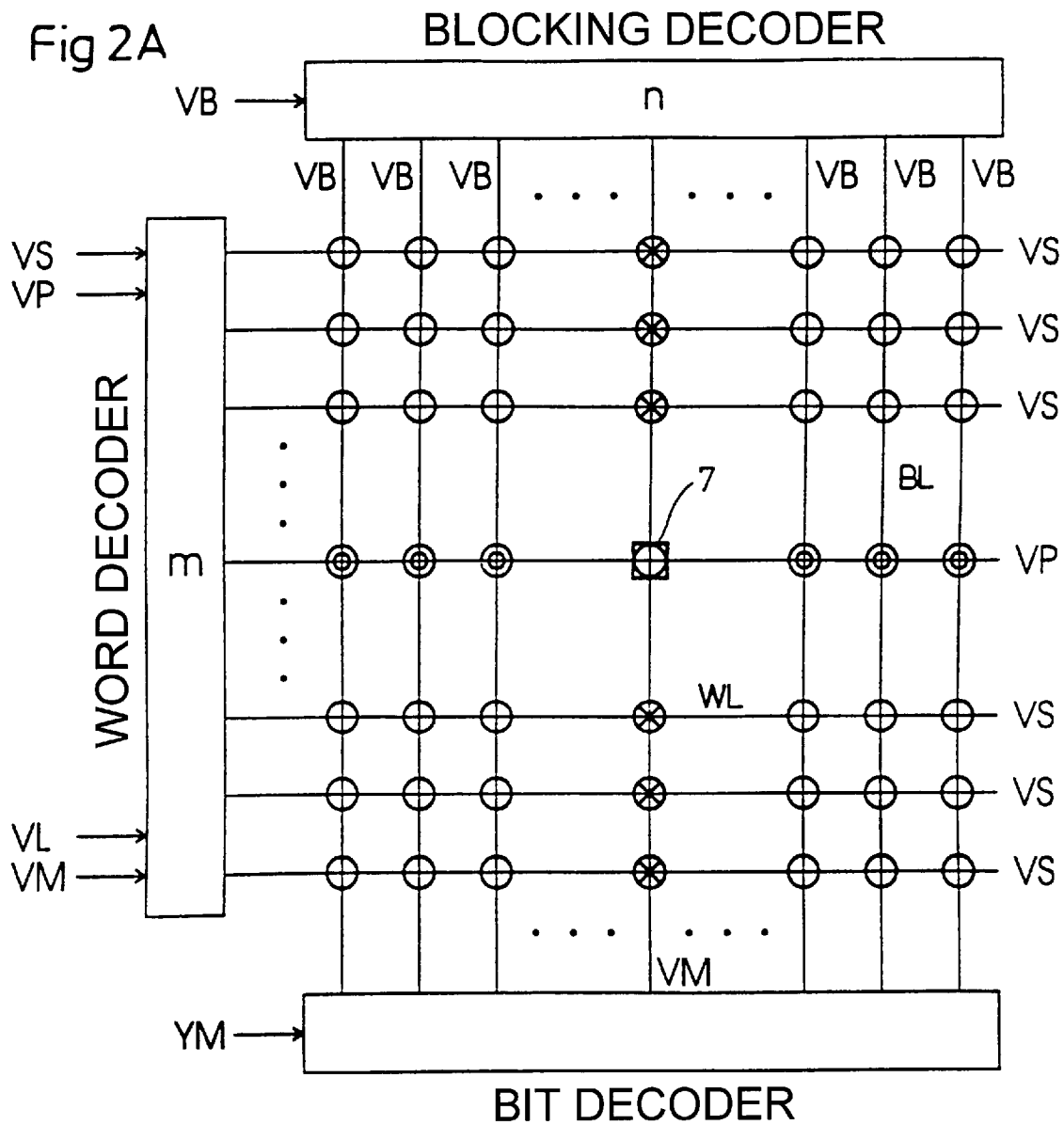
FIG. 2A is a schematic diagram of the cell field with decoder circuits illustrating the voltages in the cell field in the programming of a cell.

FIGS. 1 through 9 illustrate a memory cell incorporating principles of the invention.

Since the inventive test circuit can be applied advantageously in electrically programmable and deletable semiconductor memories, the following detailed exemplifying embodiments all relate to electrically programmable and deletable semiconductor memories with one-time programmable ("OTP") or multiple programmable ("MTP") memory cells.

Specifically, FIG. 1 depicts a separate memory cell 7 of a ROM. The memory cell 7 has a control electrode 1, a non-potential-bound electrode 2, a drain electrode 3 and a source electrode 4. The non-potential-bound electrode 2 is surrounded by an insulator 5. The control electrode I is electrically coupled to a word line WL which is allocated to the row that is ranked higher than the memory cell 7. The drain electrode 3 is electrically coupled to a bit line BL which is allocated to the column that is ranked higher than the memory cell 7. The source terminals 4 of the memory cells are coupled with each other and lie at a common, prescribable potential.

The charged and uncharged states of the non-potential-bound electrode 2 correspond to the two states of the memory cell 7. For programming, charges are injected into the non-potential-bound electrode 2 in that a positive high voltage is applied at the control electrode 1 against the drain electrode 3. The value of the positive high voltage is typically around +12 Volts. For deletion, electrons are removed from the non-potential-bound electrode 2 or holes are injected into the non-potential-bound electrode 2 in that a negative high voltage is applied at the control electrode 1 against the drain electrode 3, the value of which is typically about −12 Volts. These voltages, which in sum exceed the supply voltage, are necessary in order to overcome the potential barrier built by the insulator 5. On the basis of the high electrical field strength, electrons can tunnel through the potential barrier of the insulators (a Fowler-Nordheim effect), or hot electrons which have arisen in the vicinity of the drain electrode can overcome the insulator (a channel hot electron effect). For reading, a positive voltage of about 4 Volts is applied between the control electrode 1 and the drain electrode 3, which is, however, not sufficient to alter the charge status of the nonpotential-bound electrode 2.

For a better understanding of the inventive method, it should first be explained how the technical problem on which the invention is based has been solved until now. FIG. 2A shows the basic actuation of a cell field, whereby the voltages in the cell field in the programming of a cell mean the following:

VL=read selection potential (4 Volts)
VP=programming potential (12 Volts)
VM=mass potential (0 Volts)
VS=protective potential (8 Volts)
VB=blocking potential (4 Volts).

Figure 2B:
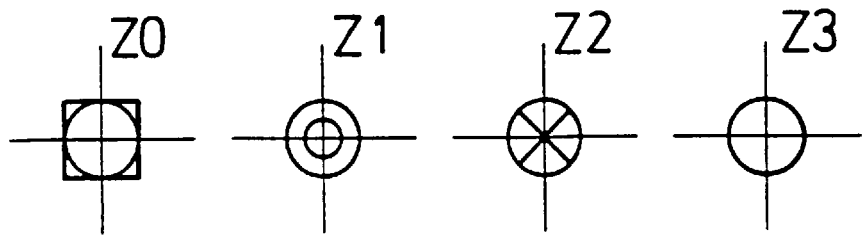
FIG. 2B is a plan view of the cells of FIG. 2A.

The variously illustrated cells in FIG. 2A are further described in FIG. 2B as follows:

Z0=cell to be programmed (12 V−0 V=12 V)
Z1=stressed cell onto high potential (12 V−4 V=8 V)
Z2=stressed cell at low potential (8 V−0 V=8 V)
Z3=unstressed cell (8 V−4 V=4 V)

A word decoder usually lies outside the cell field. Therefore, it is possible to convert the function "1 out of n" into an "n−1 out of n" function by controlled inversion via an EXOR grid:

INV (1 out of n)=(n−1 out of n)
In a controlled inversion, the following applies:
y=EXOR (W,x)
y=/x for W=1
Y=x for W=0

Figure 3A:
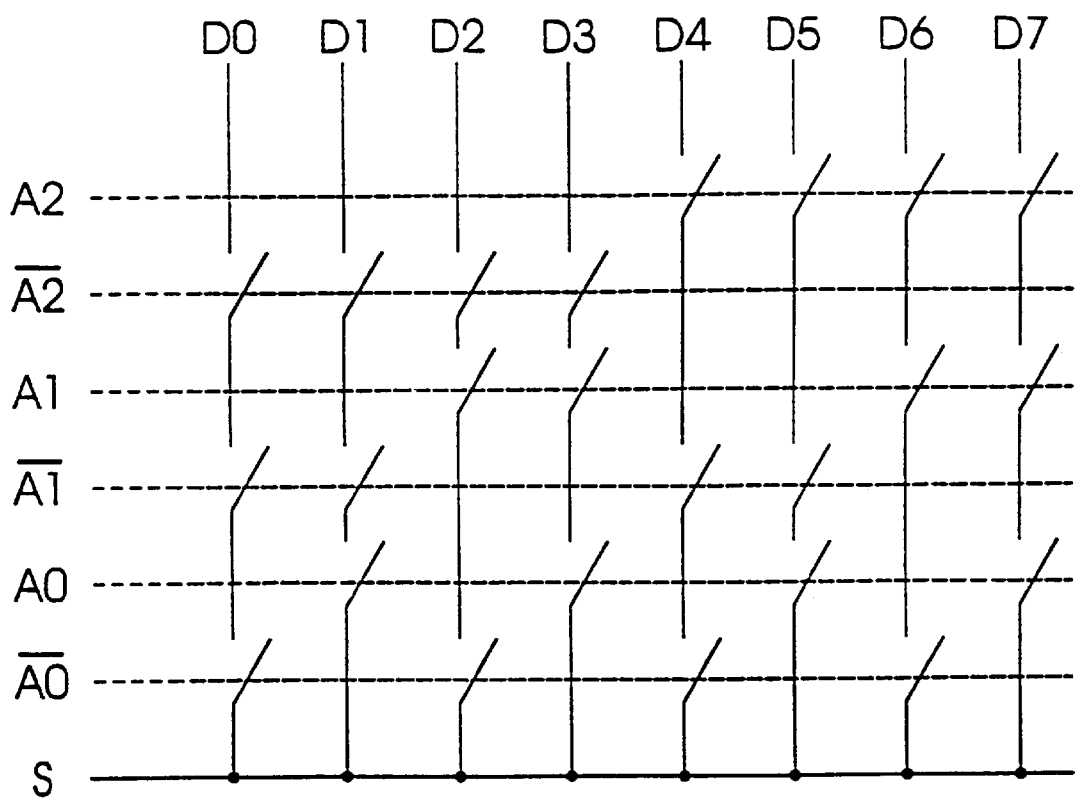
FIG. 3A is a schematic diagram of a "1 out of 8" decoder, NAND or serial decoder.
Figure 3B:
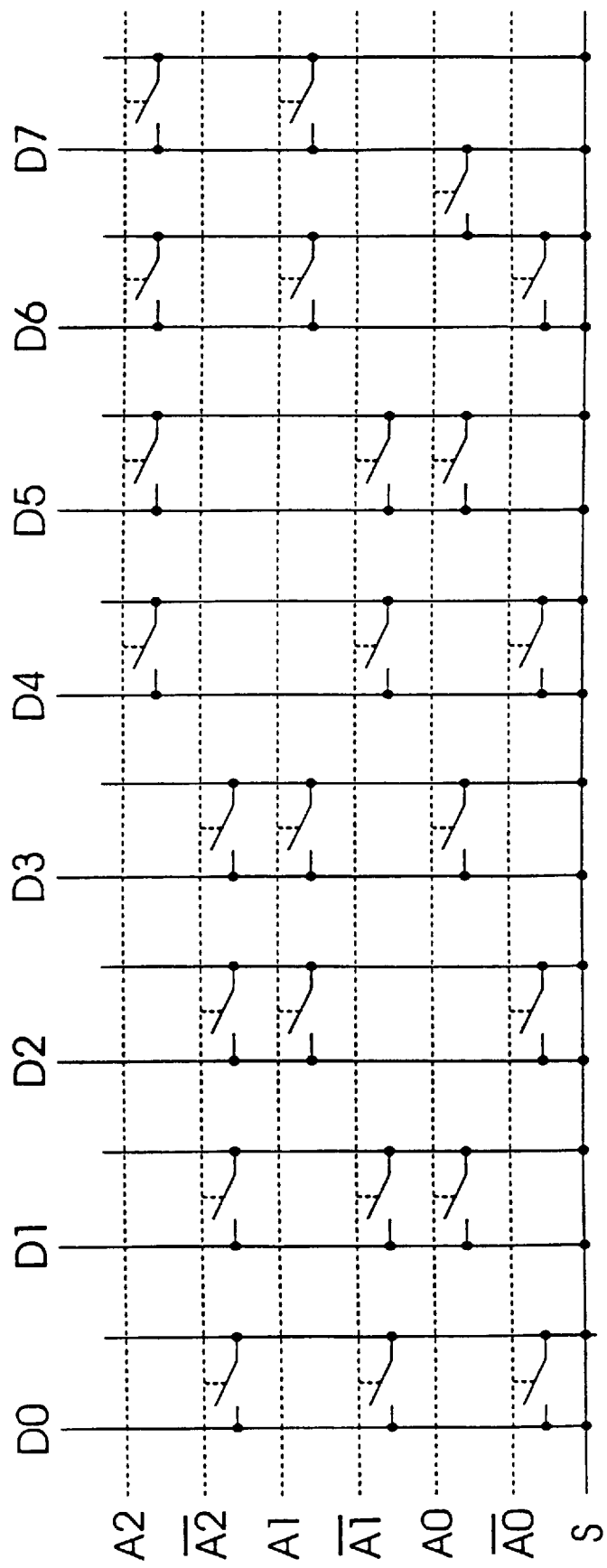
FIG. 3B is a schematic diagram of a "7 out of 8" decoder, NOR or parallel decoder.
Figure 4A:
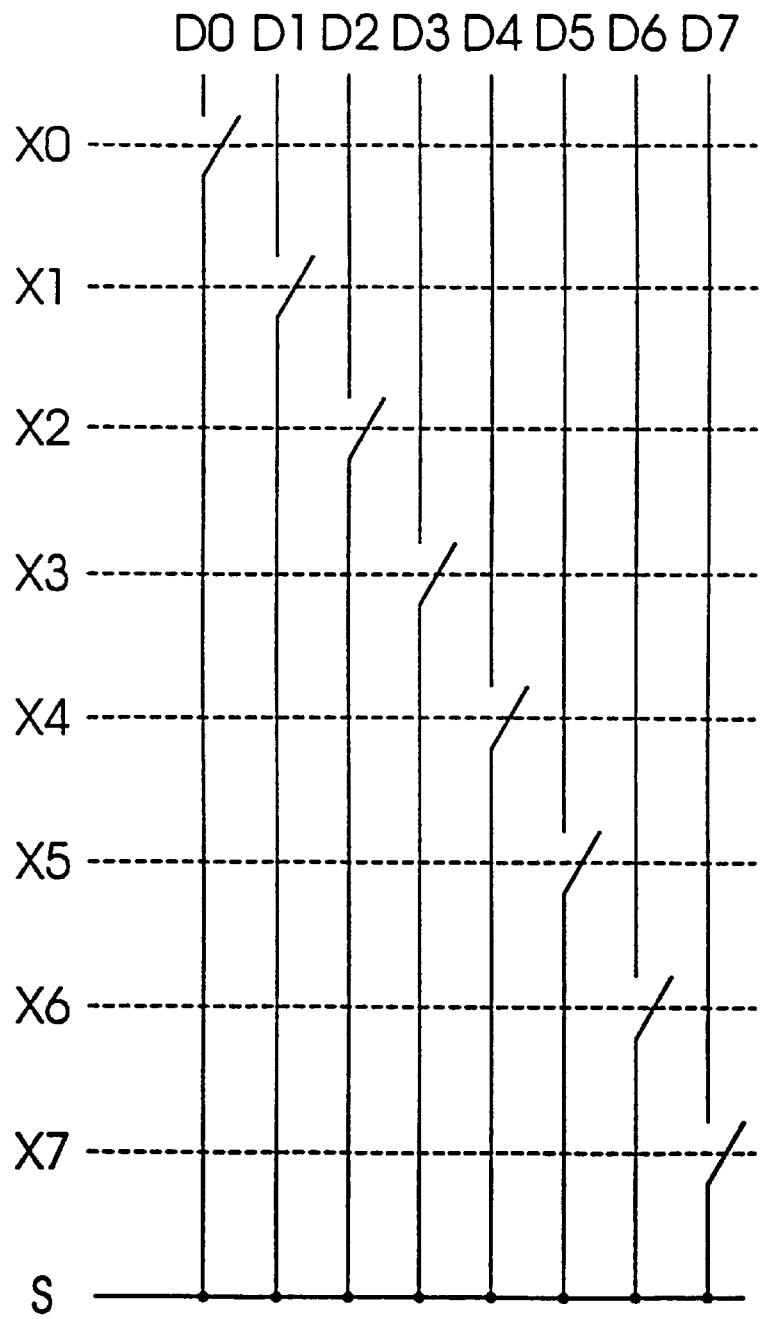
FIG. 4A is a schematic diagram of a separate switch with decoded actuation.
Figure 4B:
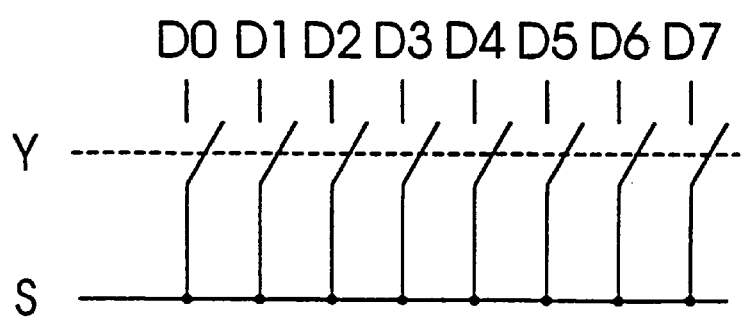
FIG. 4B is a schematic diagram of a concentration switch with an actuation.

A bit decoder and a blocking decoder generally lie in the cell field. Only one function can be realized here, either the function "1 out of n" with NAND decoders (serial switches) (as shown in FIG. 3A), or the function "n−1 out of n" with NOR decoders (parallel switches) (as shown in FIG. 3B). If both functions are required, as in the bit and blocking decoders described above, then one of the two decoders must be replaced by separate switches which are controlled by decoded signals (see FIG. 4A). These separate switches require a great deal of space.

The following are advantageous for the dynamic intermediate storage method in the cell field prior to the inventive programming. For example, it is advantageous to maintain small capacitive couplings between the word lines WL and the bit lines BL in the cell field. Also, it is advantageous to maintain small capacitive couplings between the address lines of the decoder and the bit lines BL in the cell field. Moreover, it is advantageous to maintain a minimal charge requirement for the programming of a cell in the cell field. In addition, it is advantageous to maintain nominal leakage currents of the bit lines to one another and to the substrate (i.e. no memory cells between the bit lines).

By maintaining these conditions, disturbances on the bit lines, which arise due to activating the decoders, are prevented from significantly altering the stored levels on the bit lines of the cell field.

Figure 5:
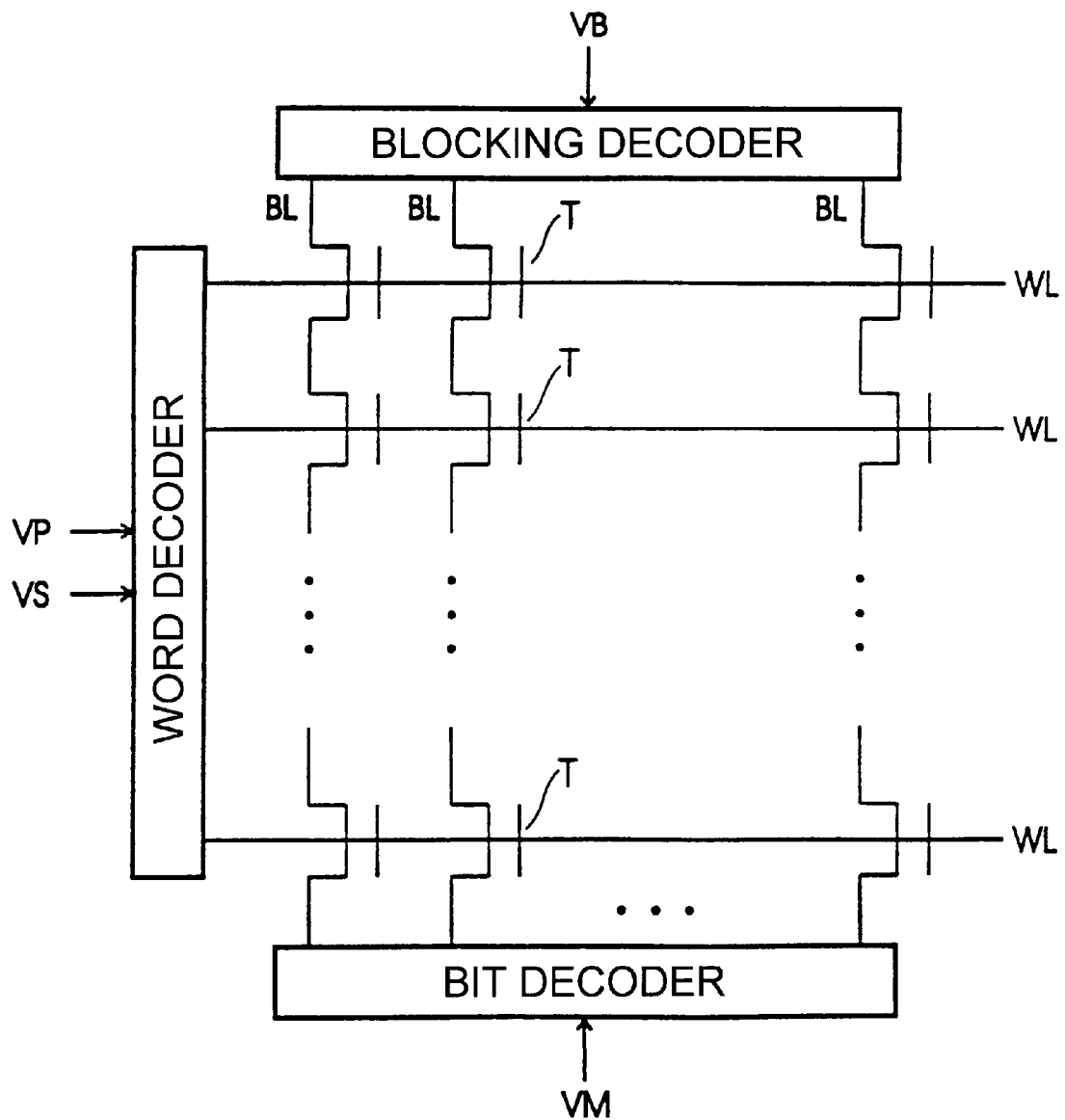
FIG. 5 is a schematic diagram of the principal construction of a memory field with MOS transistors.
Figure 6:
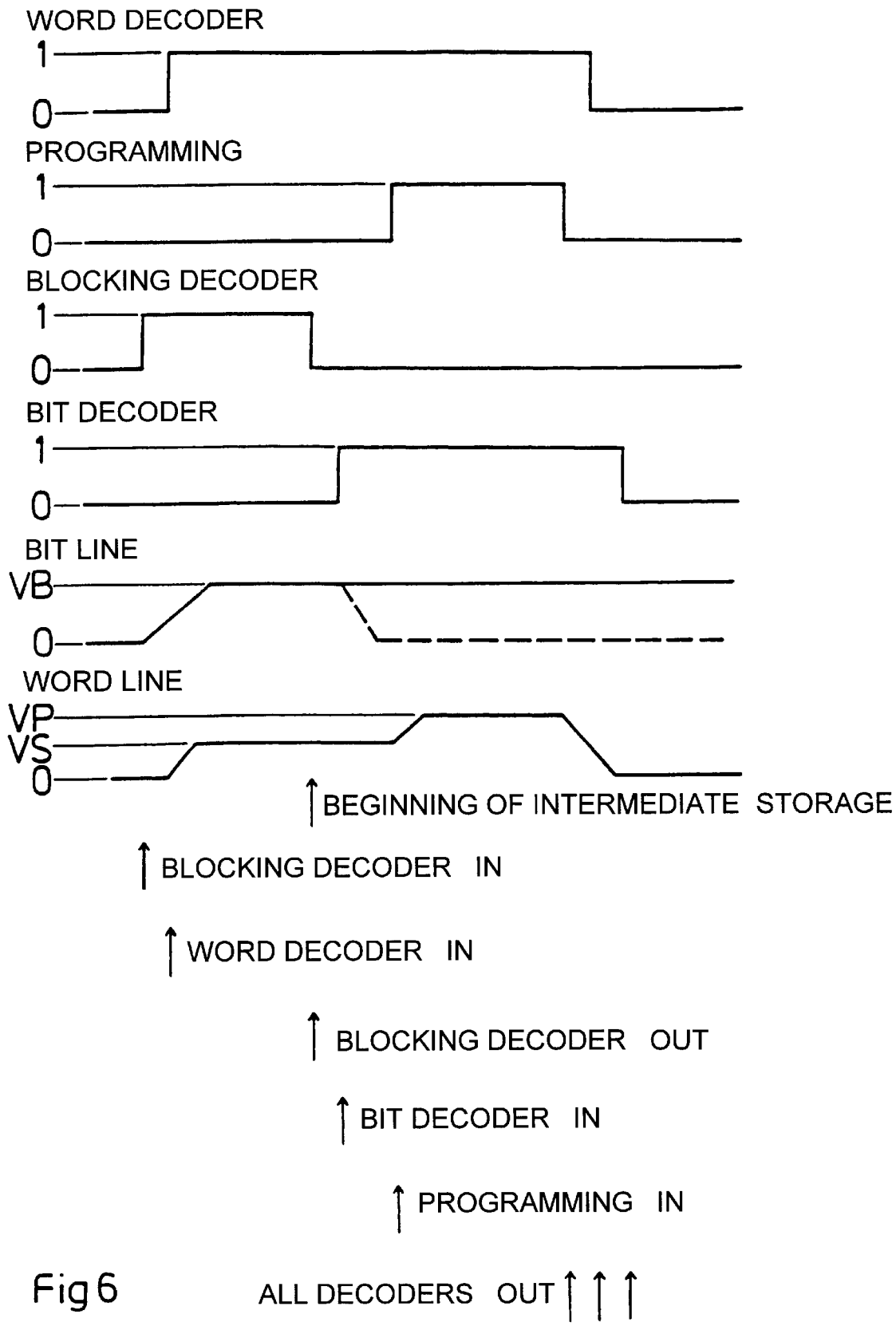
FIG. 6 is a schematic diagram of a trend display illustrating the programming sequence in the memory field according to FIG. 5.

The conditions are satisfied by memories with MOS transistors T as cells as shown in FIG. 5. In FIG. 5, the information is stored by various threshold voltages of the MOS transistors. The various threshold voltages are achieved by the storing of charges in the gate insulator (e.g. an ONO forming material) by tunnel currents.

The simplest form of dynamic intermediate storage is to capacitively store the blocking potential VB on the bit lines BL on which cells will not be programmed. The process transpires as follows, with reference to FIG. 6.

a) All bit lines BL are precharged to the blocking potential VB via the blocking decoder. The bit decoder blocks completely during this time, e.g. on all lines BL of the cell field.

b) All outputs of the word decoder are applied to the protective voltage VS, so that all the memory cells in the cell field become conductive, and the blocking potential VB is carried into the whole cell field.

c) The blocking decoder is completely disconnected from the cell field. The blocking potential VB remains stored on all capacitances of the bit lines BL.

d) The bit decoder is actuated and connects a bit line with the line which contains the information value to be programmed. This information value is transferred to the bit line ("1"=VB, "0"=VM).

e) Lastly, a word line WL is selected via the word decoder and applied to the programming potential VP. The cell is programmed at the intersection of this word line WL with the previously selected bit line BL.

f) Finally, the word decoder and the bit decoder are deactivated.

Thus, in the programming process, the information is fed to the cell field statically, and only the blocking potential VB is stored in the bit lines BL. Since, in this method, the blocking decoder is used only for the precharging of all bit lines and does not require a decoder function beyond this, it can be replaced by a simple switch series such as that shown in FIG. 4B, which results in significant savings in terms of space.

Figure 7:
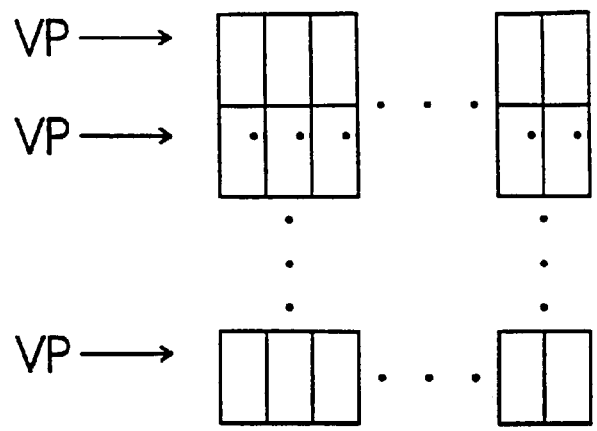
FIG. 7 is a block diagram of the number of cells in a segmented memory which are programmed in one programming cycle, given the intermediate storage of the blocking potential.

An acceleration of the programming process and a reduction of the stress load of the cells that are not programmed is not yet achieved by the above method, even if the cell field is segmented according to the schematic illustration in FIG. 7.

Figure 8:
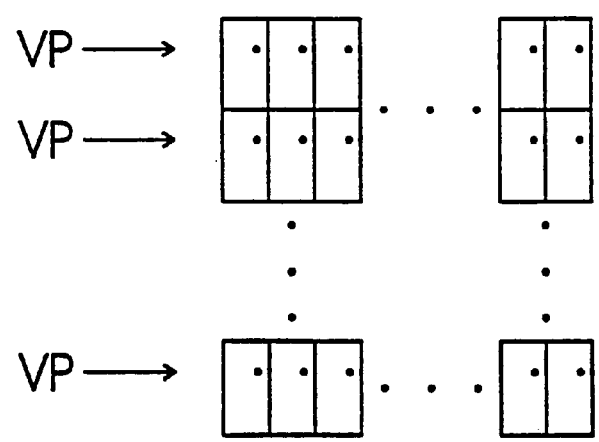
FIG. 8 is a block diagram of the number of cells in a segmented memory which are programmed in one programming cycle, given the intermediate storage of 1 bit per segment.

A further reduction in the programming times and stress cycles is achieved if, besides the blocking potential VB, the information value to be programmed is also intermediately stored on the bit lines BL corresponding to the schematic illustration according to FIG. 8. The process transpires as follows:

First, steps a to d as described above are incorporated herein. In addition, e) The bit decoders only have access to one track. Subsequent to the transfer of the information into the segments of a track, the bit decoders are disconnected again. Thus, the segments of this track not only capacitively store the blocking voltage VB but also the information of the track is stored.

f) The information of the next track is fed to the memory. The bit decoder of this track is subsequently activated. The information reaches this track and is temporarily stored there. The bit decoder is subsequently disconnected again.

g) Step f is repeated until the information to be programmed is intermediately stored on a bit line in all tracks in all segments, respectively.

h) Only now is a word line WL selected via the word decoder and applied to the programming potential VP. This word line WL reaches all the tracks, so that a bit is programmed in each segment of every track.

l) The word decoder is deactivated again subsequent to the end of the programming time.

Due to the large number of parallel-programmed cells, the number of programming cycles is reduced to the number of cells per segment. The number of stress cycles for the cells that are not programmed is reduced to the number of columns plus the number of rows in one segment (in contrast, in the previous solution, the number of stress cycles=the number of cells to be programmed).

Figure 9:
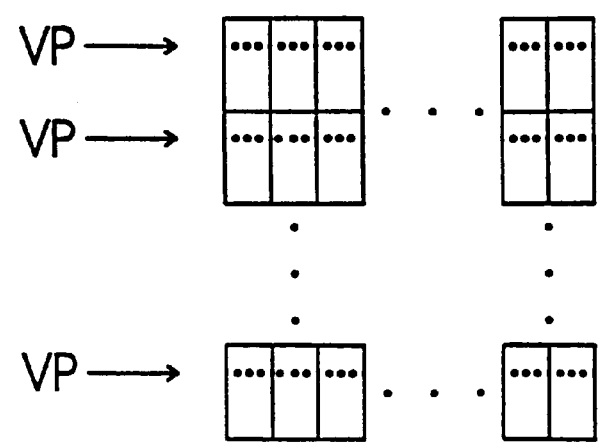
FIG. 9 is a block diagram of the number of cells in a segmented memory which are programmed in one programming cycle, given the intermediate storage of 1 row per segment.

Another way to reduce the programming time for the overall memory is to prestore entire rows of the information values to be programmed in the bit lines BL of the segments. This is schematically indicated in FIG. 9. This process transpires as follows:

First, the steps a through g are the same as above.

l) As soon as a bit is stored in all segments of all tracks the bit address is changed and the storage of the second bit is started in the first track again.

j) This process is repeated until one row of the information to be programmed is prestored in each segment in every track, respectively.

k) Only then is a word line selected via the word decoder and applied to the programming voltage VP. This word line reaches all tracks, so that a row is programmed in every segment of every track.

l) The word decoder is deactivated again subsequent to the end of the programming time.

As a result, the number of parallel-programmed cells is further increased. Moreover, the number of programming cycles is accordingly reduced to the number of rows in the segment. To this end, the number of stress cycles for the cells that are not programmed is likewise reduced to the number of rows in the segment.

It should be understood that various changes and modifications to the presently preferred embodiments described herein will be apparent to those skilled in the art. Such changes and modifications may be made without departing from the spirit and scope of the present invention and without diminishing its attendent advantages. It is, therefore, intended that such changes and modifications be covered by the appended claims.

What is claimed is:

1. A method for programming a ROM cell arrangement having a plurality of memory cells organized in cell fields in a plurality of word lines and a plurality of bit lines forming a matrix, comprising the steps of:

actuating the plurality of bit lines via a bit decoder and loading the plurality of bit lines with a mass potential;

actuating the plurality of bit lines via a blocking decoder and loading the plurality of bit lines with a blocking potential;

actuating the plurality of word lines via a word decoder and loading the word lines with one of a programming voltage and a protective voltage;

prestoring an information value to be programmed in one of the cell fields.

2. The method of claim 1, further comprises the steps of:

precharging the plurality of bit lines to the blocking potential via the blocking decoder;

applying the protective voltage to a plurality of outputs of the word decoder so that the plurality of memory cells become conductive and the blocking potential is carried into the whole cell field;

decoupling the blocking decoder from the cell field while maintaining the stored blocking potential at all capacitances of the bit lines;

activating the bit decoder and connecting one of the bit lines to a line containing the information value to be programmed and transferring the information value to the bit line;

selecting a word line via the word decoder and applying the programming potential;

programming the memory cell at an intersection of the selected word line and the previously selected bit line; and deactivating the word decoder and the bit decoder.

3. The method of claim 2, further comprising the steps of:

disconnecting the bit decoder after the step of transferring the information value into segments of a track of the cell field in which the segments of the track capacitively store both the blocking voltage and the transferred information value;

feeding an information value of a next track to the cell field, and subsequently activating the bit decoder of the next track, intermediately storing the information value of the next track in the next track and disconnecting the bit decoder again;

repeating the step of feeding an information value of a next track to the cell field until the information value to be programmed is intermediately stored on a bit line in every track in all segments of the cell field; and subsequently selecting one of the plurality of word lines via the word decoder and applying the programming potential.

4. The method of claim 3, further comprising the step of:

deactivating the word decoder subsequent to the end of the programming time.

5. The method of claim 3, further comprising the step of:

changing the bit address and starting the storing of the next information value in the first track after the information value is stored in all segments of all the tracks of the cell field;

repeating the step of changing the bit address and starting the storing of the next information value until one word line of the information value to be programmed is prestored in each segment in every track of the cell field;

subsequently selecting a word line via the word decoder and applying programming potential to the word line; and deactivating the word decoder subsequent to the end of the programming time.

* * * * *